United States Patent [19]

Shimakura et al.

[11] 3,806,778

[45] Apr. 23, 1974

[54] INSULATED-GATE FIELD EFFECT SEMICONDUCTOR DEVICE HAVING LOW AND STABLE GATE THRESHOLD VOLTAGE

[75] Inventors: Keiichi Shimakura; Hideo Tsunemitsu, both of Tokyo, Japan

[73] Assignee: Nippon Electric Company, Limited, Tokyo, Japan

[22] Filed: Dec. 21, 1972

[21] Appl. No.: 317,295

[30] Foreign Application Priority Data

Dec. 24, 1971 Japan .............................. 46-104633

[52] U.S. Cl...... 317/235 R, 317/235 B, 317/235 AZ
[51] Int. Cl. .............................................. H01l 11/00
[58] Field of Search...................... 317/235, 46, 46.5

[56] References Cited

UNITED STATES PATENTS

| | | | |
|---|---|---|---|
| 3,502,950 | 3/1970 | Nigh et al. | 317/235 |
| 3,672,984 | 6/1972 | Sato et al. | 117/212 |
| 3,663,279 | 5/1972 | Lepselter | 117/212 |
| 3,690,945 | 9/1972 | Kuisl | 117/215 |

*Primary Examiner*—Rudolph V. Rolinec
*Assistant Examiner*—E. Wojciechowicz
*Attorney, Agent, or Firm*—Sandoe, Hopgood & Calimafde

[57] ABSTRACT

An insulated-gate field effect transistor includes a gate electrode composed of a tantalum layer and an aluminum layer. An insulating film composed of a tantalum oxide layer and an aluminum oxide layer is disposed about the gate electrode and insulates the gate electrode from the source and drain electrodes. In the fabrication of the device, the aluminum oxide and tantalum oxide layers are formed by anodic oxidation.

5 Claims, 8 Drawing Figures

INSULATED-GATE FIELD EFFECT SEMICONDUCTOR DEVICE HAVING LOW AND STABLE GATE THRESHOLD VOLTAGE

This invention relates generally to semiconductor devices, and more particularly to insulated-gate type metal-insulator-semiconductor (MIS) field-effect semiconductor devices.

Since the characteristics of a MIS field-effect transistor (referred to as a MIS Tr hereinafter) are governed to a significant extent by the gate threshold voltage of the transistor (referred to as $V_T$ hereinafter), $V_T$ is an important parameter in the design and operation of these devices. The value of $V_T$ is desired to be as low as possible ("low" signifies that the absolute value is small) and stable. By reducing $V_T$, the supply voltages required to drive these devices become lower and power consumption accordingly is reduced. Moreover, by reducing $V_T$ it becomes feasible to directly couple MIS *Tr*'s with bipolar transistors, that is, therefor it becomes possible to incorporate both MIS Tr and bipolar transistors into a common single semiconductor chip and to thereby realize monolithic integrated circuits including MIS and bipolar transistors. It is also desirable that the value of $V_T$ not vary in the assembly process of and during the practical operation of the MIS Tr.

In the conventional MIS transistors, the gate electrode, other electrodes, and the necessary conductive layers are formed of aluminum and are made by successively performing the steps of opening contact holes in a protective film on a semiconductor substrate for deriving electrical connection with the substrate, depositing aluminum, and etching away the unnecessary portion of aluminum by a known photo-etching technique. The main cause for the variation and increase in the $V_T$ of the MIS Tr during this fabrication process is the migration of movable impurity ions such as $Na^+$ ions into the gate insulator film. In the conventional MIS Tr, $Na^+$ and other impurity ions intrude through the removed portion of aluminum, that is, the spacing between the electrodes, into the protective film, diffuse laterally in the film, and migrate into the gate insulator film. For this reason, considerable care is usually exercised to prevent the intrusion of these ions during the wafer preparation stage. In the subsequent stages, such as the pelletizing and assemblying stages, rinsing with an acid (nitric acid for instance) to remove $Na^+$ and other ions cannot be done because the electrodes and conductive layers of aluminum have already been introduced. Thus, these impurity ions which have adhered to the wafer surface cannot be readily removed, and these ions migrate into the gate insulator film during the pelletizing and subsequent stages of manufacture and during operation after manufacture, causing the $V_T$ of the MIS Tr to become unstable and high.

It is a common practice to provide a barrier layer of phosphosilicate glass, silicon nitride or the like on a silicon dioxide ($SO_2$) film, which exhibits a barrier effect against impurity ions. The use of such a double-layer as a gate insulator film, however, gives rise to instability of the $V_T$ as a result of polarization and hysteresis effects that are inherent in these double-layer film structures. When a phosphosilicate glass layer (the most common barrier layer) is employed, impurity ions such as $Na^+$ are trapped in the phosphosilicate glass layer with their positive charges preserved; those positive charges increase the $V_T$. Among other disadvantages that flow from the use of phosphosilicate glass are the generation of surface leakage currents that are a result of the moisture-absorbing property of phosphosilicate glass and the tendency to overetch the of contact holes in opening these holes for deriving the source and drain electrodes. Thus, the conventional double-layer gate insulator film structure fails to lower and stabilize the $V_T$ and has other disadvantages as well.

The method of converting the unnecessary portion of aluminum into $Al_2O_3$ by an anodic oxidation process to form electrodes and conductive layers, rather an removing that portion by etching is known. The term "anodic oxidation" as herein employed is defined as a process of dipping a semiconductor wafer into an electrolytic solution and thereafter electrochemically converting a predetermined portion of the metal into a metallic oxide by applying a forming voltage between the wafer and an electrode disposed in the solution. However, the $Al_2O_3$ film thus formed is devoid of sufficient barrier effects to prevent the intrusion of externally originating impurity ions. Therefore, the $V_T$ cannot be sufficiently lowered and stabilized by use of and anodic oxidation method in the fabrication of the conventional MIS Tr.

The anodic oxidation method, when used to form electrodes and conductive layers in the conventional MIS Tr, has another defect in that this method can not be practically applied to the manufacture of a P-channel MIS Tr, because it is difficult to supply the necessary forming voltage through the semiconductor substrate to the aluminum, and hence the unnecessary portion of aluminum remains partially unconverted.

It is an object of this invention to provide an insulated-gate field effect semiconductor device having a low and stable gate threshold voltage.

It is another object of this invention to provide a novel electrode structure of an insulated-gate field effect semiconductor device which makes it possible to apply the anodic oxidation method to manufacture a P-channel type device as well as an N-channel type device.

In the MIS Tr of this invention the gate electrode is composed of a double layer of tantalum and aluminum and the surface protective film around the gate electrode is covered with an insulating film composed of a double layer of tantalum oxide an aluminum oxide. In practice, it is more convenient that all the electrodes including the gate electrode and the other conductive layers provided on the surface of a semiconductor wafer are formed of a tantalum-aluminum double layer, and the remaining surface of the wafer not covered with the electrodes and conductive layers is covered with a tantalum oxide-aluminum oxide double insulating layer.

It has been found that tantalum oxide acts as a strong barrier to impurity ions such as $Na^+$ ions and the gate insulator film is not contaminated with impurity ions even if it is not covered with a phosphosilicate glass layer. In other words, the phosphosilicate glass layer becomes unnecessary, and the $V_T$ of an MIS Tr can be made stable and low according to this invention. Moreover, it has been found that the value of the $V_T$ of the MIS Tr according to the invention is lower than that expected from the absence of the phosphosilicate glass layer. It is considered that the use of the tantalum-aluminum double layer as a gate electrode reduces the gate threshold voltage $V_T$. As is known, $V_T$ depends on the work function of the metal of the gate electrode. However, the work function of tantalum is not so different from that of aluminum which is used as the gate electrode metal in conventional MIS *Tr*'s. For the present, the reason for the unexpected decrease in $V_T$ is not known.

The thickness of the tantalum layer in the double metal layer may range from 100 to 1,000 angstroms and is preferably between 500 and 1,000 angstroms. The thickness of the aluminum layer in the double metal layer is preferably greater than 1 micron, and in practice a thickness of the aluminum layer of between 1.0 and 1.7 micron is favorable.

The tantalum oxide and aluminum oxide layers may be conveniently formed by the anodic oxidation of the tantalum and aluminum double layers. More particularly, these double insulating layers may be formed by successively depositing tantalum and aluminum over the surface of a semiconductor substrate in which the necessary regions such as the source and drain regions have already been formed and which has previously been coated with a gate insulator film and a necessary protective film. Unnecessary portion of aluminum are thereafter selectively converted into aluminum oxide by anodic oxidation, and selective anodic oxidation of tantalum is performed by using the remaining aluminum as a mask. Since a forming voltage can be supplied through the tantalum layer to the aluminum layer in the selective anodic oxidation of the aluminum, a P-channel type MIS Tr can be fabricated by the anodic oxidation method. Moreover, it is considered that fabrication by the anodic oxidation method may contribute to a decrease in the $V_T$.

The invention is described in greater detail by an explanation of an embodiment thereof, with reference to the drawings in which.

Figure 1:
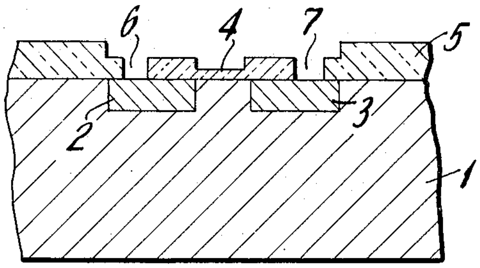
FIGS. 1 to 5 are schematic cross-sectional views of a MIS Tr according to this invention in the respective steps of manufacture thereof.

Referring to FIG. 1, a semiconductor wafer containing an N-type silicon substrate 1 having an N-type impurity in concentration of about $10^{15}/cm^3$ is initially provided. In the N-type substrate 1, P-type source and drain regions 2 and 3 are formed, and a gate insulator film 4 and a surface-protective insulating film 5 are formed on the surface of substrate 1, both films 4 and 5 being composed of silicon oxide which has no barrier effect against impurity ions. The gate insulator film 4 is provided between the source and drain regions 2 and 3. Contact holes 6 and 7 are opened in film 5 to enable electrical connections to be made to the source and drain regions 2 and 3. The structure of the semiconductor wafer shown in FIG. 1 is not the subject matter of the invention and may be produced by any known method.

Figure 2:
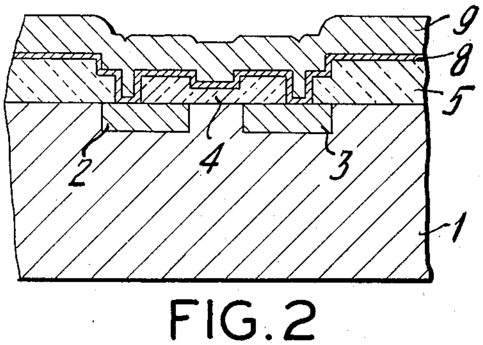

Referring to FIG. 2, a tantalum layer 8 of about 700 angstroms in thickness and an aluminum layer 9 of about 1.5 micron in thickness are deposited over the surface of the silicon substrate 1 coated with the gate insulator film 4 and the surface-protective film 5. Since the surface of tantalum, when exposed in air, is easily oxidized, the tantalum and aluminum are continuously evaporated within the same bell jar without breaking vacuum during the formation of tantalum-aluminum double metallic layers 8 and 9.

Figure 3:
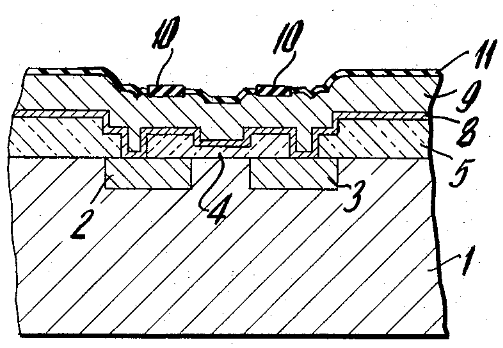

Thereafter, selective anodic oxidation of the double metallic layers is performed. At first, a provisional mask 10 a photoresist, silicon oxide, glass or the like is provided to cover that portion of the aluminum layer 9 that is to be converted into the oxide, as shown in FIG. 3. When a photoresist is employed as provisional mask 10, the entire surface of the aluminum layer 9 is preferably first converted into a porous aluminum oxide film (not shown) of about 0.1 micron in thickness by anodic oxidation using a 10 percent chromic acid aqueous solution at a constant forming voltage of 10V for 10 minutes. That porous aluminum oxide film is effective to increase the adhesiveness of the photoresist in the subsequent anodic oxidation process.

Returning to FIG. 3, the semiconductor wafer with the provisional mask 10 is immersed into a forming solution of ethylene glycol saturated with ammonium borate. By connecting the substrate 1 and the metallic layers 8 and 9 to an anode of a constant forming voltage source of 80V and an electrode disposed in the forming solution to the cathode of the voltage source, selective anodic oxidation is carried out for 15 minutes to convert the surface of the aluminum layer 9 not covered with the provisional mask 10 into a dense, non-porous aluminum oxide film 11 of about 0.1 micron in thickness. When a porous aluminum oxide film has already been formed over the surface of the aluminum layer 9, the dense aluminum oxide film 11 is formed beneath this porous aluminum oxide film.

Thereafter, the provisional mask 10 ia removed, and selective anodic oxidation is carried out in the same manner as mentioned above by using the dense aluminum oxide film 11 as a mask in a forming solution of 10 percent dilute sulfuric acid with a constant forming voltage of 20V. As a result of this latter selective anodic oxidation, the entire thickness of the portion of the aluminum layer 9 that was formerly covered with the provisional mask and which is no longer covered with the dense aluminum oxide film 11, is converted into porous aluminum oxide 12, as shown in FIG. 4.

Figure 4:
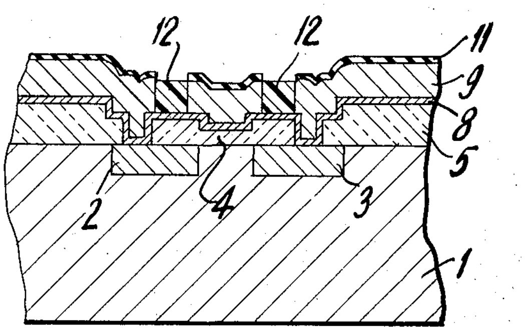

In the anodic oxidation operation shown in FIG. 4, the underlying tantalum layer 8 serves as a path for the forming current, whereby the unmasked portion of aluminum can be completely oxidized despite some variation in the thickness of the aluminum layer 9, and there is thus no possibility of the occurrence of residual, unconverted aluminum in the aluminum oxide 12. It is also possible to employ as a mask 11 in the anodic oxidation process shown in FIG. 4, silicon oxide, silicon nitride, glass, a metal such as titanium or the like in place of the dense aluminum oxide. In such a case, the process described in relation to FIG. 3 is not necessary.

A subsequent anodic oxidation is carried out in a 3 percent aqueous solution of ammonium citrate with a constant forming voltage of 200V. In this process, the remaining aluminum layer 9 is used as a mask, and the unmasked portion of the tantalum layer 8 is converted over its entire thickness into a tantalum oxide layer 13, as shown in FIG. 5.

Because the tantalum layer 8 is very thin (1,000 angstroms or less and 700 angstroms in this embodiment), any variation in film thickness in evaporation is reduced to a minimum and the unmasked portion of this layer is converted to a uniform oxide layer without any residual tantalum portions.

Figure 5:
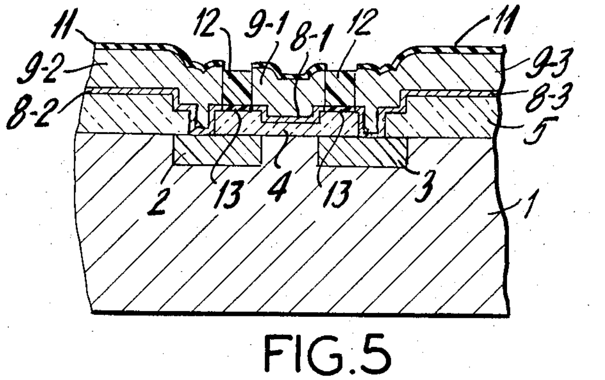

The MIS Tr as thus fabricated is shown in FIG. 5, in which a gate electrode is composed of tantalum layer 8–1 and aluminum layer 9–1 disposed over the gate insulator film 4. The source and drain electrodes are composed of tantalum-aluminum double layers 8–2 and 9–2; and 8—3 and 9–3 respectively, which are connected through contact holes 6 and 7 (see FIG. 1) to the source and drain regions 2 and 3, respectively. Other conductive layers and extensions of these electrodes may also be composed of successive tantalum-aluminum double layers. The spacings between the gate electrode and the source electrode and between the gate electrode and the drain electrode are filled with a double-layer insulating film composed of tantalum oxide 13 and aluminum oxide 12. The aluminum layers 9–1, 9–2 and 9–3 of the respective electrodes are coated with the dense aluminum oxide film 11.

Figure 6:
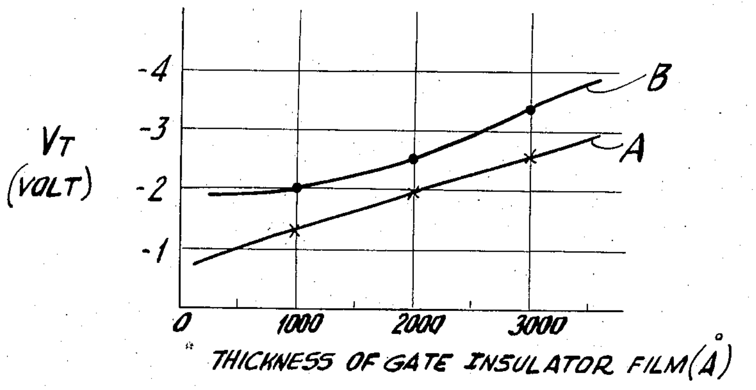
FIG. 6 is a graph showing $V_T$ as a function of the thickness of the gate insulator film in the MIS Tr of this invention and in a conventional MIS Tr.
Figure 7A:
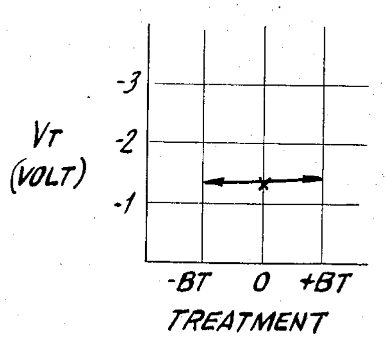
FIGS. 7A and 7B respectively show $V_T$ as a function of B-T treatment in the MIS Tr of this invention and in a conventional MIS *Tr*.
Figure 7B:
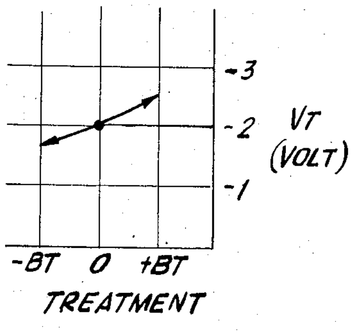

The technical advantages that are attained by the MIS Tr of the invention will be now described. Referring to FIG. 6, a curve B shows a value of $V_T$ of a conventional MIS T*r* as a function of the thickness of a gate insulator film and a curve A shows the relation of $V_T$ and the thickness of the gate insulator film of the MIS Tr of the invention. In the conventional MIS Tr, the gate insulator film is composed of a silicon oxide layer and a phosphosilicate glass layer, and electrodes are formed only of aluminum. In such a structure, it is difficult to achieve a value of $V_T$ less than −2V even if the gate insulator film is made as thin as 1,000 angstroms, as shown by the curve B. In contrast, the MIS T*r* of this embodiment, in which the thickness of the gate insulator film 4 may be made conveniently between 1,000 and 3,000 angstroms, has a significantly reduced value of $V_T$, as indicated by the curve A. For instance, the value of $V_T$ in the MIS Tr of the invention is −1.2V, for a gate insulator thickness of 1,000 angstroms. FIG. 7 shows the results of the so-called B-T treatment in which a bias voltage of +20V or −20V is applied to the gate electrode of an MIS T*r* heated at a temperature of 250° C for a period of 1 hour. In the abscissa of FIG. 7, 0 represents the state before the B-T treatment, +BT shows the result of the B-T treatment with positive bias, and −BT is the result of the B-T treatment with negative bias. FIG. 7A shows the result for the MIS T*r* of the embodiment shown in FIG. 5, while FIG. 7B is the result for the conventional MIS T*r* mentioned above in which both of the MIS T*r*'s have a gate insulator film of 1,000 angstroms in thickness. As is apparent from FIG. 7, the $V_T$ of the conventional MIS Tr is very unstable, whereas in the MIS T*r* of the invention, the $V_T$ is hardly changed with the B-T treatment and hence is very stable.

Further, the dense aluminum oxide film 11 covering the aluminum layer surface contributes greatly to a reduction of troubles such as short-circuiting of the electrodes due to an accumulation of dirt or dust and mechanical damage to the electrodes as a result of scratches, thereby resulting in marked improvements in both reliability and manufacturing yields.

In a P-channel type MIS Tr such as that shown in FIG. 3, the substrate 1 is of N-type conductivity, while source and drain regions 2, 3 are of P-type conductivity. A reverse bias voltage of 80 to 90V must therefore be applied to supply a forming voltage from the substrate 1 through the P-N junction in the reverse direction through the source and drain regions 2, 3 to the metallic layer 9. However, it is impossible to make a non-porous aluminum oxide film 11 which stands against a voltage of more than 20 to 30V. Accordingly, the forming voltage to be applied to the metallic layer 9 must be supplied from the metallic layer 9 per se. In the convertional MIS T*r*, no metallic layer such as tantalum layer 8 in FIG. 3 is present under the aluminum layer 9. Since the aluminum layer is relatively thick (1 micron or more), its thickness inevitably varies, and depending on the variation of the thickness of that layer, the aluminum often remains unconverted to aluminum oxide at the final stage of anodic oxidation which takes place from the aluminum surface. For this reason, the anodic oxidation method cannot be employed in the fabrication of a conventional P-channel MIS T*r*. In contrast, the MIS T*r* of this invention has the underlying tantalum layer 8 which can serve to supply the forming current to the aluminum layer 9 during anodic oxidation. Since tantalum is hardly anodized by the electrolyte that is used for the anodic oxidation of aluminum, the anodic oxidation of the aluminum layer 9 can continue until the entire predetermined portion of the aluminum layer 9 is converted into aluminum oxide by the forming current flowing through the tantalum layer even when the thickness of the aluminum layer varies. Thus, a P-channel type MIS T*r* can be easily produced according to this invention.

It will be understood that the invention can also be applied with equal advantage to the fabrication of an N-channel type MIS T*r* in which the substrate is of a P-type conductivity and the source and drain regions are of N-type conductivity.

Thus, although the invention has been herein described with respect to a single embodiment thereof, it will be appreciated and understood that variations may be made therein, all without departing from the spirit and scope of the invention.

We claim:

1. An insulated-gate field effect semiconductor device comprising a semiconductor substrate, a gate insulator film disposed on a part of the surface of said substrate, a gate electrode disposed on said gate insulator film, source and drain regions formed in said substrate, and source and drain electrodes respectively in contact with said source and drain regions, each of said gate, source, and drain electrodes comprising a double metallic layer including a tantalum layer and an aluminum layer, and an insulating film disposed between said gate electrode and said drain and source electrodes, said insulating film comprising a double layer including a tantalum oxide layer and an aluminum oxide layer.

2. The device of claim 1, in which said tantalum layer has a thickness of between 100 and 1,000 angstroms, and said aluminum layer has a thickness of at least 1 micron.

3. An insulated-gate field effect semiconductor device comprising a semiconductor substrate, source and drain regions formed in said substrate, a gate insulator film and a first insulating film covering a part of the surface of said substrate, a gate electrode disposed on said gate insulator film, source and drain electrodes connected respectively to said source and drain regions and extending onto the surface of said first insulating film, and a second insulating film disposed on the surface of said first insulating film not covered with said electrodes, said electrodes comprising a tantalum layer and an aluminum layer, and said second insulating film comprising a tantalum oxide layer and an aluminum oxide layer.

4. The device of claim 3, in which the thickness of said tantalum layer and said aluminum layer range from 500 to 1,000 angstroms and from 1 to 1.7 micron, respectively.

5. A method of producing an insulated-gate field effect transistor, comprising the steps of forming source and drain regions in a semiconductor substrate, covering the surface of said substrate with a gate insulator film and an insulating film, forming openings in said insulating film for making electrical connection to said source and drain regions, depositing a tantalum layer over the surface of said substrate coated with said gate insulator film and said insulating film, depositing an aluminum layer over the surface of said tantalum layer, selectively converting a predetermined portion of said aluminum layer into an aluminum oxide layer by anodic oxidation, and selectively converting a predetermined portion of said tantalum layer into a tantalum oxide layer by anodic oxidation, the unoxidized portions of said aluminum layer and said tantalum layer constituting double metallic layer gate, source, and drain electrodes, said tantalum oxide layer and said aluminum oxide layer constituting an insulating film disposed between and providing insulation between said double metallic layer gate electrode and said double metallic layer source and drain electrodes.

* * * * *